United States Patent [19]

Tijburg et al.

[11] 3,753,804

[45] Aug. 21, 1973

[54] METHOD OF MANUFACTURING A SEMICONDUCTOR DEVICE

[75] Inventors: Rudolf Paulus Tijburg; Teunis van Dongen, both of Emmasingel, Eindhoven, Netherlands

[73] Assignee: U.S. Philips Corporation, New York, N.Y.

[22] Filed: Aug. 31, 1971

[21] Appl. No.: 176,646

[30] Foreign Application Priority Data

Sept. 8, 1970 Netherlands .......................... 703226

[52] U.S. Cl. .............................. 148/177, 317/234 L

[51] Int. Cl. ................................................ H01l 7/46

[58] Field of Search.................... 148/177, 178, 179, 148/181

[56] References Cited

UNITED STATES PATENTS

| | | | |
|---|---|---|---|
| 2,934,685 | 4/1960 | Jones | 148/179 |
| 3,096,259 | 7/1963 | Williams | 148/177 |
| 3,386,893 | 6/1968 | Hornig | 148/177 |
| 3,388,012 | 6/1968 | Fallon | 148/177 |
| 3,513,040 | 5/1970 | Kaye | 148/178 |

*Primary Examiner*—Hyland Bizot
*Attorney*—Frank R. Trifari

[57] ABSTRACT

The invention relates to a method of providing a low-resistance ohmic contact on an n-type $A^{III}B^{V}$ semiconductor body, in which a doping layer from a metal and germanium is alloyed on the body. Upon cooling after alloying not only the germanium-doped $A^{III}B^{V}$ compound separate but also germanium as such. It has been found that the contact resistance can be reduced if a donor for germanium is added to the doping layer as a result of which doped germanium is formed upon cooling after alloying.

10 Claims, 3 Drawing Figures

Figure 1:
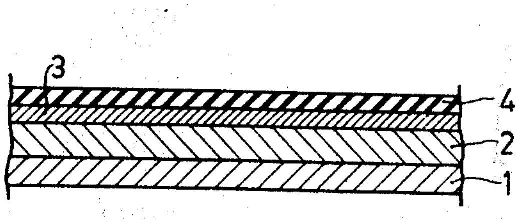

*INVENTORS*
RUDOLF P. TIJBURG
TEUNIS VAN DONGEN
*BY*
AGENT

METHOD OF MANUFACTURING A SEMICONDUCTOR DEVICE

The invention relates to a method of manufacturing a semiconductor device, in which a low-resistance ohmic contact is provided on a part of an n-type semiconductor body which consists essentially of an $A^{III}B^{V}$ compound or a mixed crystal thereof, by providing on a surface of the semiconductor body a doping layer comprising a metal and germanium which in the semiconductor causes n-type conductivity and heating the body and the layer at a temperature at which the doping layer and the semiconductor body alloy, the assembly being then cooled and doped semiconductor material being deposited on the semiconductor body.

The invention furthermore relates to a semiconductor device manufactured by means of this method.

Semiconductor devices which are manufactured by the above method are, for example, avalanche diodes, varactor diodes, Schottky diodes, light-emissive diodes and Gunn effect microwave devices.

An article in "Solid State Electronics" 10, pp. 381–383 (1967) describes a method of providing an ohmic $n^+$ contact on an n-type gallium arsenide body by providing a doping layer comprising gold and germanium on the gallium arsenide body and alloying it with this body.

After alloying, cooling is generally carried out rapidly in order to prevent decomposition of the $A^{III}B^{V}$ compound as much as possible.

It is found that after cooling the deposited semiconductor material has a rather considerable contact resistance.

One of the objects of the invention is to improve this. The invention is based on the finding that certain additions to the doping layer can considerably reduce the contact resistance.

The method mentioned in the preamble is therefore characterized according to the invention in that a doping layer is used which comprises a donor for germanium. Gallium arsenide or gallium phosphide is preferably used as an $A^{III}B^{V}$ compound.

The effect of the presence of a donor in the doping layer is apparent in particular in a preferred embodiment of the method according to the invention in which cooling is carried out slowly after alloying and during cooling the semiconductor body has a lower temperature than the adjacent alloy of the semiconductor material and the doping layer.

In this preferred embodiment, $n^+$ $A^{III}B^{V}$ semiconductor material doped with germanium is first deposited on the semiconductor body and then a doping layer comprising germanium is deposited on the doped semiconductor material. Addition of a donor for germanium, for example arsenic, to the doping layer, results in incorporation of the donor in the germanium deposited on the doped semiconductor material, as a result of which the contact resistance is reduced.

The effect of the presence of a donor is unexpected in particular because during alloying of the $A^{III}B^{V}$ semiconductor body of, for example, gallium arsenide, with the doping layer, it could be expected that arsenic is formed by the deposition of the gallium arsenide. Obviously, the quantity of arsenic formed by the decomposition, even with slow cooling and hence comparatively long stay at high temperature, is insufficient to dope the deposited germanium to any considerable extent.

Arsenic is preferably used as a donor impurity and the arsenic concentration in the doping layer preferably is from 0.5 to 2 percent by weight. Phosphorus and antimony may also be used as donor impurities for the germanium.

The metal in the doping layer can be for example, gold, silver or tin. Indium also can be used as a metal the solubility of arsenic in germanium being much larger than that of indium, as a result of which the deposited germanium yet shows n-conductivity.

A doping layer is preferably used having from 80 to 88 percent by weight of gold, from 12 to 20 percent by weight of germanium and from 0.5 to 2 percent by weight of arsenic.

The effect of the presence of a donor impurity in the doping layer is also obvious in another preferred embodiment of the invention, in which, after cooling, the doping layer is removed and a metallic contact layer is provided on the semiconductor material.

The doping layer may be removed by dissolving in a solvent for the metal of the doping layer, for example, mercury or liquid gallium. Neither the deposited semiconductor material nor the deposited germanium is attacked by it.

The said metallic contact layer consists, for example, of gold or silver or of two metal layers, the first of which consists, for example, of chromium, aluminium or titanium, and the second of which consists of gold or silver.

The invention furthermore relates to a semiconductor device manufactured by means of the method according to the invention.

In order that the invention may be readily carried into effect, it will now be described in greater detail, by way of example, with reference to the drawing and an embodiment.

Figure 2:
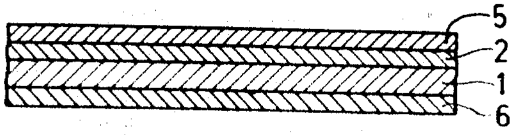
Figure 3:
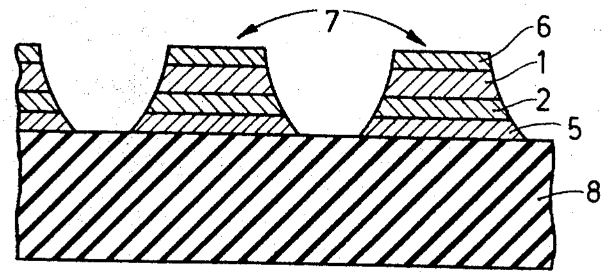

FIGS. 1 to 3 are sectional views of a part of a semiconductor device during successive stages of the manufacture by the method of the present invention.

On a semiconductor body consisting of a disc 1 of gallium arsenide of the $n^+$ conductivity type (FIG. 1) there is provided in the usual manner an epitaxial gallium arsenide layer 2 of the n-conductivity type. The resistivity of the disc 1 is about 0.001 Ohm.cm and that of the layer 2 is about 0.3 ohm.cm. The thickness of the disc is 30 $\mu$u and the thickness of the epitaxial layer is 20 $\mu$u.

A mixture of 87 percent by weight of Au, 12 percent by weight of Ge and 1 percent by weight of As is then deposited on the surface of the epitaxial layer 2 in a high vacuum apparatus. As a result of this the doping layer 3 is formed which is 1 to 1.5 $\mu$u thick. The layer 3 is then provided in the usual manner with a 0.25 $\mu$u thick layer 4 of pyrolytic silicon oxide at approximately 400°C.

The silicon oxide layer 4 forms a screening by which evaporation, if any, of arsenic can be avoided and the flatness of the ultimate contact can be furthered.

The semiconductor body and the doping layer are then heated at a temperature at which the body and the layer alloy.

Alloying takes place in a furnace which comprises an external heating device which maintains the furnace at approximately 200°C, while the temperature is brought at approximately 500°C by means of an internal heating device. Prior to heating, the semiconductor body is placed in the furnace so that the silicon oxide layer 4 is in direct contact with the internal heating device.

The temperature is maintained at approximately 500°C for approximately 2.5 minutes, the epitaxial layer 2 and the doping layer 3 alloying with each other, cooling being then carried out slowly at a rate of, e.g., 180°C per hour, germanium-doped semiconductor material being deposited on the semiconductor body and arsenicdoped germanium being deposited on the semiconductor material. The whole alloying process is carried out in an atmosphere of very pure hydrogen.

During cooling, the temperature distribution in the furnace is adjusted so that at least the temperature of the epitaxial layer is lower than that of the adjacent alloy of the semiconductor material and the doping layer. As a result of this the recrystallisation of the gallium arsenide at the surface of the comparatively highohmic layer 3 is furthered.

After cooling, the silicon oxide layer 4 is removed in the usual manner and the doping layer 3 is removed by means of mercury or molten gallium which do not attack or pollute the doped gallium arsenide and the doped germanium.

The thickness of the recrystallized layer is approximately 1,000 A.

A metallic contact layer 5 (see FIG. 2) is provided on the doped semiconductor material by vapour deposition and consists of two metal layers namely a first metal layer of titanium and a second metal layer of gold, which layers are not shown separately in FIG. 2.

The contact resistance which was measured in the usual manner is $10^{-4}$ ohm/cm². In the absence of arsenic the contact resistance under otherwise the same conditions is 3-5.$10^{-4}$ ohm/cm².

Simultaneously and in the same manner as described above, namely by means of a doping layer, the disc 1 can be provided with a metallic contact layer 6. Although during cooling of the doping layer on the disc the temperature gradient is not optimum, the provision of an ohmic contact with low contact resistance on the disc is a less critical process than on the epitaxial layer, since said layer has a considerably higher resistivity than the disc.

The disc 1 can be assembled in a usual manner *via* the layer 5 on a rigid substrate 8, for example, glass, after which mesa's 7 having a diameter of from 160 to 190 $\mu$u can be formed by means of a photo-etching treatment (see FIG. 3) and the substrate 8 be removed. The individual mesas can be mounted in a suitable holder by means of the thermo-compression process and be used as Gunn effect devices.

In the method according to the invention, the doped semiconductor material is very low-ohmic, as a result of which a good contact can be obtained by vapour deposition of a metallic contact layer without subsequent alloying.

The invention is not restricted to the above-described example. In addition to Gunn effect devices lightemissive diodes may be manufactured, for example. In addition to gallium arsenide, gallium phosphide and the mixed crystals of the two compounds are to be considered.

What is claimed is:

1. A method of producing a semiconductor device, comprising the steps of:

a. providing a semiconductor body of material selected from the group consisting essentially of a $A^{III}B^{V}$ compound and a mixed crystal thereof, said body having at a major surface a portion having n-type conductivity;

b. providing on said major surface portion a doping layer consisting essentially of a metal, germanium, and a material that is a donor impurity for said germanium, said germanium when incorporated imparting a higher n-type conductivity to said body portion;

c. heating said body and said doping layer so as to alloy said doping layer and said semiconductor body portion; and d. cooling said body and said layer so that said surface portion of said body becomes doped with said germanium and there is formed at said major surface a deposited region comprising germanium into which is incorporated said donor impurity from said doping layer, thereby providing a low resistance ohmic contact to said semiconductor body.

2. A method as recited in claim 1, wherein said compound is one of gallium arsenide and gallium phosphide.

3. A method as recited in claim 1, wherein said cooling is carried out at a low rate in a heating apparatus adjusted such that the temperature distribution during cooling is such that said semiconductor body has a lower temperature than the adjacent alloy of the semiconductor material and the doping layer.

4. A method as recited in claim 1, wherein said donor impurity is arsenic and is present in said doping layer in an amount of from about 0.5 to about 2 percent by weight.

5. A method as recited in claim 1, wherein said doping layer contains from about 80 to about 88 percent by weight of gold, from about 12 to about 20 percent by weight of germanium and from about 0.5 to about 2 percent by weight of arsenic.

6. A method as recited in claim 1, wherein the residual part of said doping layer is removed subsequently to said cooling step and a metallic contact layer is then provided on the semiconductor material.

7. A method as recited in claim 1, wherein said metal of said doping layer is one of gold, silver, indium, and tin.

8. A method as recited in claim 1, wherein said donor impurity is one of phosphorus, arsenic, and antimony.

9. A method as recited in claim 1, wherein said donor impurity material is the same as the $B^{V}$ component of said $A^{III}B^{V}$ component.

10. A method as recited in claim 1, wherein said semiconductor body comprises an epitaxial surface layer of said n-conductivity type and said material and said alloying is carried out at said epitaxial layer.

* * * * *

PO-1050
(5/69)

UNITED STATES PATENT OFFICE
CERTIFICATE OF CORRECTION

Patent No. 3,753,804 Dated August 21, 1973

Inventor(s) RUDOLF P. TIJBURG ET AL

It is certified that error appears in the above-identified patent and that said Letters Patent are hereby corrected as shown below:

On the Title page, Section [30] change "703226" to

--7013226--.

Column 3, line 48, delete "u".

Signed and sealed this 29th day of January 1974.

(SEAL)
Attest:

EDWARD M.FLETCHER,JR.
Attesting Officer

RENE D. TEGTMEYER
Acting Commissioner of Patents